United States Patent
Zondler et al.

(10) Patent No.: US 11,161,414 B2
(45) Date of Patent: Nov. 2, 2021

(54) CIRCUIT AND METHOD FOR DETECTING A CREEPING SHORT CIRCUIT IN BRIDGE CONNECTIONS

(71) Applicant: Robert Bosch GmbH, Stuttgart (DE)

(72) Inventors: Johannes Zondler, Stuttgart (DE); Federico Ignacio Sanchez Pinzon, Kornwestheim (DE); Yannick Chauvet, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 202 days.

(21) Appl. No.: 16/484,217

(22) PCT Filed: Jan. 10, 2018

(86) PCT No.: PCT/EP2018/050513
§ 371 (c)(1),
(2) Date: Aug. 7, 2019

(87) PCT Pub. No.: WO2018/145845
PCT Pub. Date: Aug. 16, 2018

(65) Prior Publication Data
US 2020/0025816 A1    Jan. 23, 2020

(30) Foreign Application Priority Data

Feb. 13, 2017   (DE) .......................... 102017202191.8

(51) Int. Cl.
*B60L 3/00*      (2019.01)
*G01R 19/00*     (2006.01)
(Continued)

(52) U.S. Cl.
CPC .......... *B60L 3/003* (2013.01); *G01R 19/0092* (2013.01); *G01R 19/165* (2013.01); *G01R 31/52* (2020.01)

(58) Field of Classification Search
CPC .. G01R 31/50; G01R 19/0092; G01R 19/165; G01R 31/52; G01R 31/007; B60L 2240/549; B60L 3/003; B60L 3/0069
(Continued)

(56) References Cited

U.S. PATENT DOCUMENTS 2,325,308 A * 7/1943 Davis ..................... G05B 1/027
                                                236/68 C
2,906,928 A * 9/1959 Clifford ................. G08B 17/06
                                                361/165
(Continued)

FOREIGN PATENT DOCUMENTS

DE         8705971 U1    8/1987
DE    102007050298 A1    4/2009
(Continued)

OTHER PUBLICATIONS

International Search Report for PCT/EP2018/050513, dated Apr. 17, 2018.

*Primary Examiner* — Christopher P McAndrew
(74) *Attorney, Agent, or Firm* — Norton Rose Fulbright US LLP; Gerard Messina

(57) ABSTRACT

A circuit for detecting a creeping short circuit in bridge connections. The circuit includes a first detection device for a power loss at a battery-side connection of the bridge connection to a first counting register and a second detection device for a power loss at a ground-side connection of the bridge connection to a second counting register.

12 Claims, 3 Drawing Sheets

(51) Int. Cl.
  *G01R 19/165* (2006.01)
  *G01R 31/52* (2020.01)
(58) Field of Classification Search
  USPC .......................................................... 324/522
  See application file for complete search history.

(56) References Cited

U.S. PATENT DOCUMENTS

| | | | | |
|---|---|---|---|---|
| 3,476,906 | A * | 11/1969 | Rovan | H01J 37/304 219/121.34 |
| 3,713,020 | A * | 1/1973 | Kohler | G01R 31/52 324/511 |
| 3,895,284 | A * | 7/1975 | Schweizer | H02J 7/0078 320/134 |
| 5,382,946 | A * | 1/1995 | Gale | G01R 31/006 324/510 |
| 5,467,240 | A * | 11/1995 | Williamson | H02H 11/005 323/276 |
| 5,530,360 | A * | 6/1996 | Kerchaert | B60T 8/885 324/379 |
| 5,606,242 | A * | 2/1997 | Hull | H02J 7/00047 320/106 |
| 6,320,389 | B1 * | 11/2001 | Tamesue | G01R 31/007 324/509 |
| 7,579,811 | B2 * | 8/2009 | Sato | H01M 10/486 320/134 |
| 8,571,738 | B1 * | 10/2013 | Potter | B60L 3/0069 701/22 |
| 8,581,596 | B2 * | 11/2013 | Kagoshima | B60L 3/04 324/522 |
| 9,170,292 | B2 * | 10/2015 | Chang | G01R 31/52 |
| 10,725,115 | B2 * | 7/2020 | Chang | G01R 31/52 |
| 2002/0190733 | A1 * | 12/2002 | Kinoshita | G01F 1/6986 324/713 |
| 2003/0112570 | A1 * | 6/2003 | Koida | H02H 3/08 361/93.9 |
| 2004/0183561 | A1 * | 9/2004 | Takekoshi | G01R 1/0433 324/750.03 |
| 2005/0099160 | A1 * | 5/2005 | Asaumi | H02J 7/005 320/132 |
| 2013/0141136 | A1 * | 6/2013 | Wolff | G01R 15/148 324/764.01 |
| 2013/0268812 | A1 * | 10/2013 | Liu | G05B 15/02 714/57 |
| 2014/0095089 | A1 * | 4/2014 | Wu | G01R 31/3835 702/63 |
| 2015/0168497 | A1 * | 6/2015 | Tabatowski-Bush | G01R 31/382 324/426 |
| 2015/0175027 | A1 * | 6/2015 | Garcia-Flores | G01R 31/3648 324/426 |
| 2015/0176517 | A1 * | 6/2015 | Park | F02M 21/0293 701/103 |
| 2015/0198652 | A1 * | 7/2015 | Schepp | H02H 3/105 324/551 |
| 2015/0295219 | A1 * | 10/2015 | Kamiya | H01M 50/543 429/158 |
| 2015/0300428 | A1 * | 10/2015 | David | F16D 48/064 192/30 W |
| 2016/0124043 | A1 * | 5/2016 | Datta | G11C 7/1057 714/731 |

FOREIGN PATENT DOCUMENTS

| | | |
|---|---|---|
| DE | 102008044301 A1 | 6/2010 |
| DE | 102014211739 A1 | 12/2015 |
| DE | 102015101235 A1 | 7/2016 |
| DE | 102016215324 A1 | 2/2018 |

* cited by examiner

CIRCUIT AND METHOD FOR DETECTING A CREEPING SHORT CIRCUIT IN BRIDGE CONNECTIONS

FIELD OF THE INVENTION

The present invention relates to a circuit for detecting a creeping short circuit in bridge connections and a method for detecting the creeping short circuit with the aid of the circuit. Furthermore, the present invention relates to a computer program which carries out each step of the method when it runs on a computing device, and a machine-readable memory medium which stores the computer program. Finally, the present invention relates to an electronic computing device which is configured to carry out the method according to the present invention.

BACKGROUND INFORMATION

Today, electrical circuits, primarily in the automotive sector, must conform to certain safety requirements. These requirements include the detection of short circuits. A distinction is made here between a low-resistance short circuit, which is also designated as a hard short circuit, and a medium-resistance short circuit, which is designated as a soft or creeping short circuit. Significantly smaller currents flow during creeping short circuits than during hard short circuits. Short circuits in electrical circuits may lead to malfunctions and to thermal overheating of components.

In the case of a bridge connection, two voltage dividers, i.e. a series circuit made from resistors, are switched in parallel and connected to each other with the aid of a bridge branch. In practice, peak currents having great current intensities occur for a few microseconds during operation of the bridge connection. In order to ensure the complete scope of functions of the bridge connection, such peak currents must be permitted, without incorrectly concluding that a short circuit has occurred. Generally, these peak currents are taken into consideration in the detection of short circuits and a short circuit is not detected until a detected current intensity lies above a characteristic current intensity of the peak currents. However, as previously described, creeping short circuits have significantly lower current intensities which lie below or are equal to the characteristic current intensities of the peak currents.

The power loss designates the part of the (active) power which is converted into heat in the electric components. With the aid of the power loss, it may be concluded that the electric components are damaged by excessive development of heat, i.e. by thermal overheating.

SUMMARY OF THE INVENTION

A circuit is provided for detecting a creeping short circuit in bridge connections. The bridge connection has at least one battery-side connection which is connected to the voltage supply, in particular to a battery, and a ground-side connection which is connected to the ground. The circuit for detecting the creeping short circuit includes a first detection device for a power loss at the battery-side connection of the bridge connection, the first detection device having a first counting register. In addition, it includes a second detection device for a power loss on the ground-side connection of the bridge connection, the second detection device having its own second counting register. The advantage thus arises that the power losses may be detected at the two connections independently from each other, and consequently a deviation may be recognized between the two power losses.

The first and the second detection devices are advantageously configured to compute the power losses using the square of a measured current intensity of the current flowing through the particular connection. The computation may be carried out with the aid of the so-called $I^2t$ principle, as arises from the unpublished German application having the reference number DE 10 2016 215 324.2, for example. The underlying principle of the $I^2t$ principle is that the power loss is proportional to the square of the current intensity. In addition, the power loss may be integrated over time in order to compute an energy loss, which in turn may be used to implement a switch-off condition for the electrical circuit to be protected. In the circuit configuration arising from DE 10 2016 215 324.2, an analog-digital converter is used, on the one hand, which is implemented by a comparator, whose switching threshold for switching off the electrical circuit is adapted to the load current. On the other hand, a counting register is used to implement an integrator, with the aid of which the power loss is integrated. The count value of the counting register is increased or decreased as a function of the current intensity and thresholds dependent thereon. For the purpose of squaring the current intensity to compute the power loss, a complex arithmetic element may be dispensed with in this case by suitably selecting the switching thresholds and the counting register. Thus, in the known $I^2t$ principle, a measured current is squared to obtain the power loss. This may be advantageously implemented through the combination of the analog-digital converter and the counting register arising from DE 10 2016 215 324.2. In this implementation of the $I^2t$ principle, this counting register advantageously corresponds to the counting register used in the present circuit, thus being able to dispense with components.

The first and the second counting registers are advantageously configured to increase their count values as a function of the power loss, which had been detected by the particular detection device associated with the counting register. The dependence may have in principle an arbitrary functional correlation and may therefore also be implemented via variables which are a function of the detected power loss, for example of a corresponding energy or of the current/current intensity.

The counting register has, in particular, a maximum count value. This maximum count value represents a critical energy loss, at which the converted heat would lead to a thermal overheating of the components involved. Each counting register may have its own maximum count value which may be selected depending on the components. However, the same maximum count value may be used in both counting registers if the same components are used at both connections so that the two counting registers may be better compared. The maximum count value may be combined with the previously described $I^2t$ principle.

In addition, a method for detecting the creeping short circuit in bridge connections is provided with the aid of the previously described circuit. In this method, the power loss is detected at the battery-side connection of the bridge connection by the first detection device. Subsequently, the first count value of the first counting register associated with the first detection device is increased as a function of the power loss at the battery-side connection. Furthermore, the power loss is detected at the ground-side connection of the bridge connection by the second detection device. Analogously, the second count value of the second counting register associated with the second detection device is increased as a function of the power loss at the ground-side connection. For this, care should be taken that the two count values are increased at the same increment and to the same degree. However, this does not mean that the two count values are increased simultaneously and jointly. Instead, as already explained, the first count value is increased as a function of the power loss at the battery-side connection, and the second count value is increased as a function of the power loss at the ground-side connection. As previously described, it also applies here that the dependence may have, in principle, an arbitrary functional correlation, and therefore may also be implemented via variables which are a function of the detected power loss, for example of a corresponding energy or of the current/current intensity.

The first count value of the first counting register and the second count value of the second counting register are subsequently compared with each other. Over the course of this, a potential deviation is recognized between the first count value and the second count value. In particular, the amount of a difference between the first count value and the second count value, or vice versa, may be computed for this. If the deviation between the first count value and the second count value lies above a threshold value, a creeping short circuit is detected. The threshold value is selected in such a way that tolerances, for example of the material, are taken into consideration. The method is based on distinctive power losses, which are caused due to the creeping short circuit. In contrast, peak currents having increased current intensities would increase the power losses at both connections equally. In contrast to the detection of short circuits based on absolute values, for example absolute current intensities, which must lie above a threshold value, the advantage thus arises that the creeping short circuit is also recognized at low current intensities. Furthermore, the detection of hard short circuits, in which high current intensities occur (above the peak currents), is not influenced.

As previously described, it is advantageous to detect the particular power loss by squaring the current intensity of the particular current, in particular with the aid of the $I^2t$ principle.

Optionally, the comparison of the first count value and the second count value is carried out only if one of the two count values has reached the maximum count value. In the case that the maximum count values of the two counting registers are the same, it is only checked during the comparison between the first count value and the second count value, whether at the point in time at which one of the two count values reached the maximum count value, the other count value has likewise reached the maximum count value, or a deviation between the two count values is below the threshold value at this point in time. In this case, it is an increased load, for example due to peak currents, which leads to greater currents at both connections. If, however, the deviation is greater than the threshold value, the creeping short circuit is detected. On the one hand, this has the advantage of better detectability, on the other hand, the detection of the creeping short circuit is carried out close to the critical energy loss at which the converted heat would lead to thermal overheating of the components involved.

To protect the components involved from thermal overheating due to the heat converted in the critical power loss, the bridge connection may be switched off according to one aspect, if one of the count values reaches the maximum count value.

The computer program is configured to carry out each step of the method, in particular, when it is carried out on an arithmetic unit. This facilitates the implementation of the method in a conventional electronic arithmetic unit, without having to carry out structural changes to same. For this purpose, it is stored on the machine-readable memory medium.

By uploading the computer program onto a conventional electronic arithmetic unit, the electronic arithmetic unit is obtained which is configured to detect creeping short circuits.

Exemplary embodiments of the present invention are depicted in the drawings and elucidated in greater detail in the following description.

DETAILED DESCRIPTION

Figure 1:
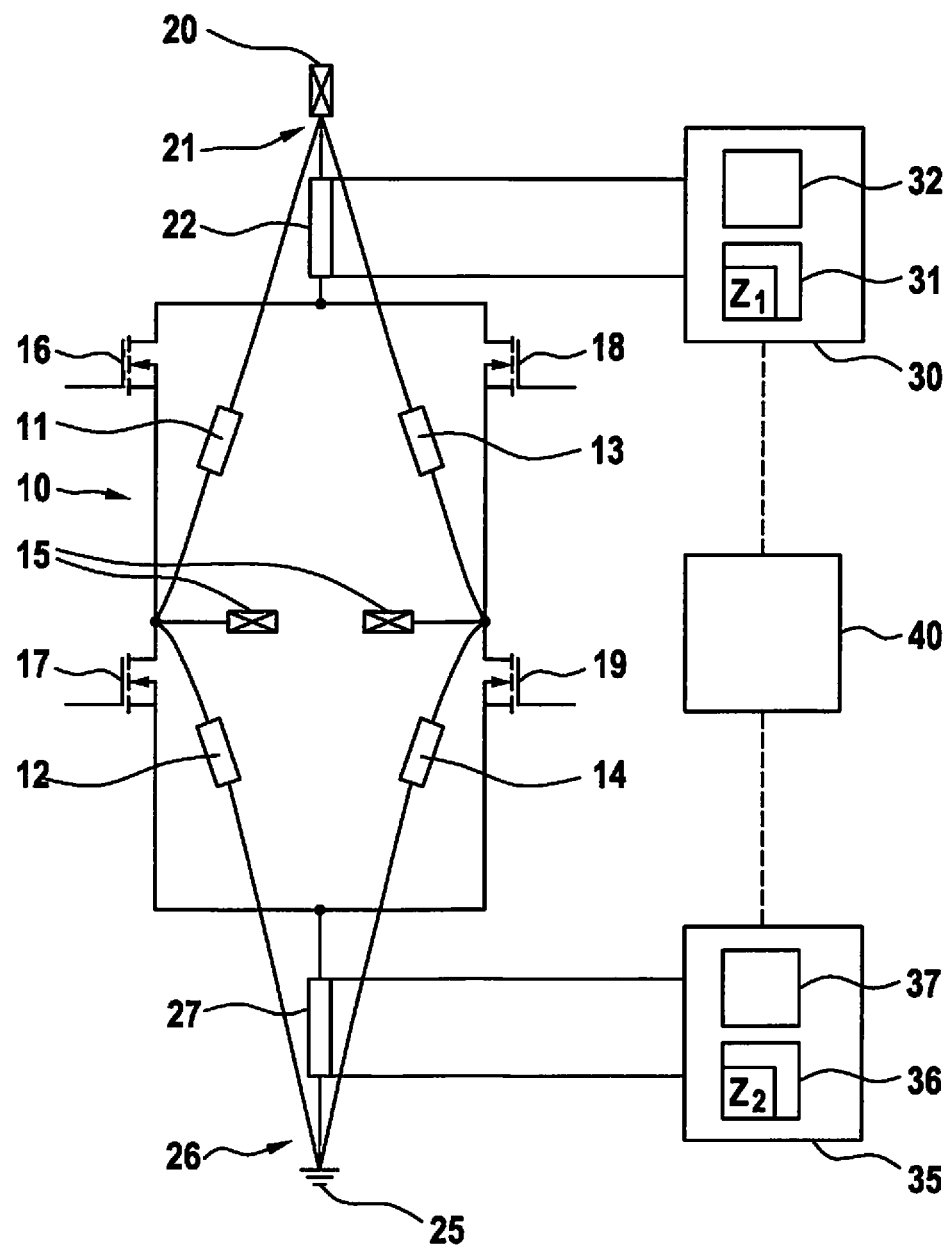
FIG. 1 shows a circuit diagram of one exemplary embodiment of the circuit according to the present invention.

The circuit according to the present invention is depicted in one exemplary embodiment as a circuit diagram in FIG. 1. A bridge connection 10 has four resistors 11, 12, 13 and 14, each two resistors 11 and 12 or 13 and 14 being connected in series and these being connected in turn in parallel to each other, which are connectable with the aid of a bridge branch 15. Furthermore, the bridge connection has four field effect transistors 16, 17, 18 and 19, for example metal oxide semiconductor field-effect transistors (MOSFET), via which bridge connection 10 is controlled.

Bridge connection 10 is supplied with voltage via a potential difference between a battery 20 and a ground 25. A battery-side connection 21 of bridge connection 10 is connected to battery 20 and has a battery side shunt 22 (shunt resistor). A ground-side connection 26 of bridge connection 10 is connected to ground 25 and has a ground-side shunt 22. In addition, a first detection device 30 is connected to battery-side connection 21; it measures current intensity $I_{bat}$ of the current through battery-side shunt 22 and computes therefrom the corresponding power loss with the aid of the so-called $I^2t$ principle by squaring current intensity $I_{bat}$ of the current through battery-side shunt 22. For this purpose, first detection device 30 includes a first counting register 31 and a first analog-digital converter 32. A first count value $Z_1$ of first counting register 31 is increased therein as a function of the power loss at battery-side connection 21. In the same way, a second detection device 35 is connected to ground-side connection 25; it also measures current intensity $I_{gnd}$ of the current through ground-side shunt 27 and computes therefrom the corresponding power loss with the aid of the $I^2t$ principle by squaring current intensity $I_{gnd}$ of the current through ground-side shunt 27. For this purpose, second detection device 35 similarly includes a second counting register 36 and a second analog-digital converter 37. A second count value $Z_2$ of second counting register 36 is increased therein as a function of the power loss at ground-side connection 25. First detection device 30 and second detection device 35 are connected to an electronic arithmetic unit 40 which may compare first count value $Z_1$ of first counting register 31 and second count value $Z_2$ of second counting register 36 with each other.

Figure 2:
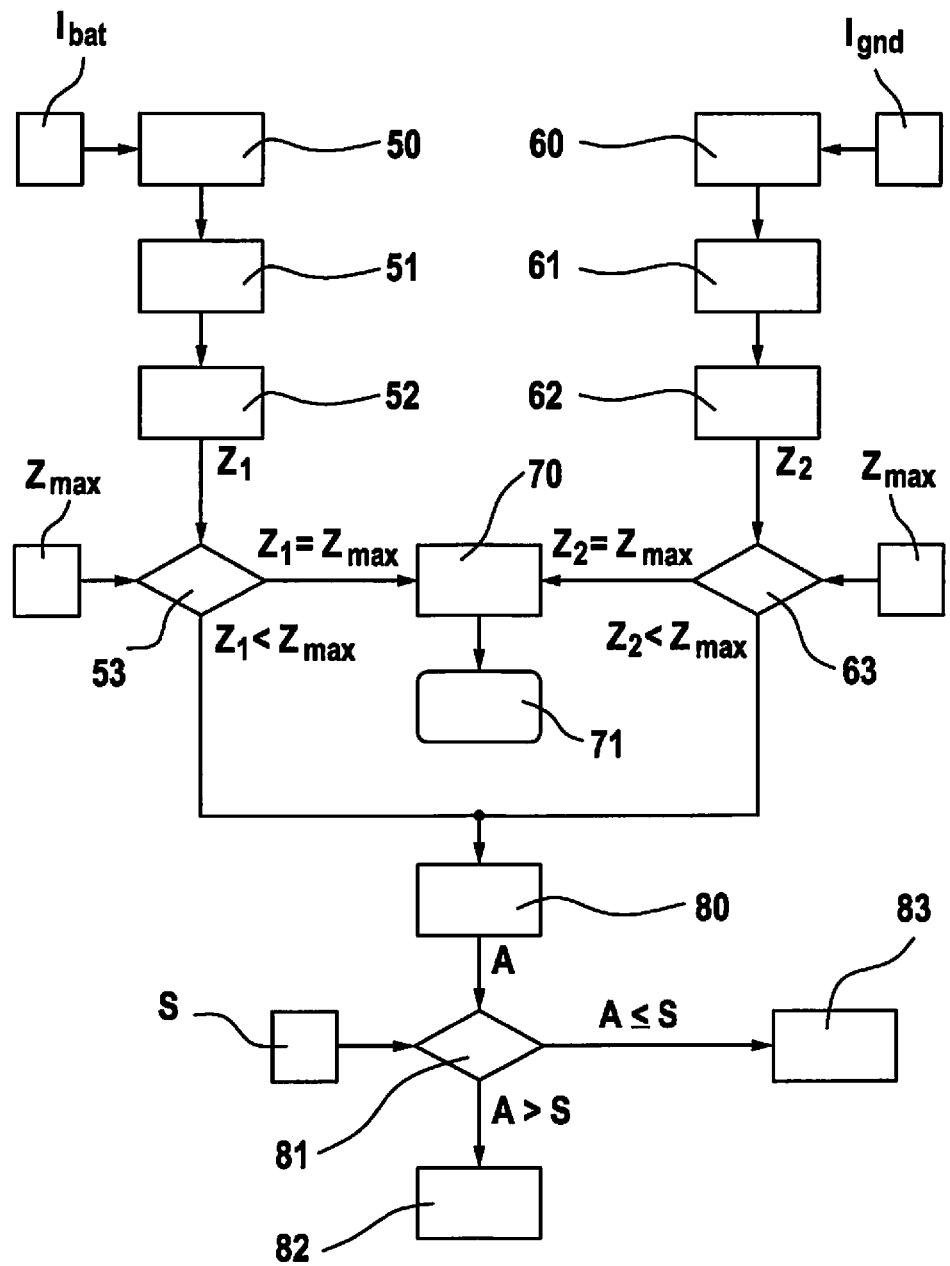
FIG. 2 shows a flowchart of one exemplary embodiment of the method according to the present invention.
Figure 3:
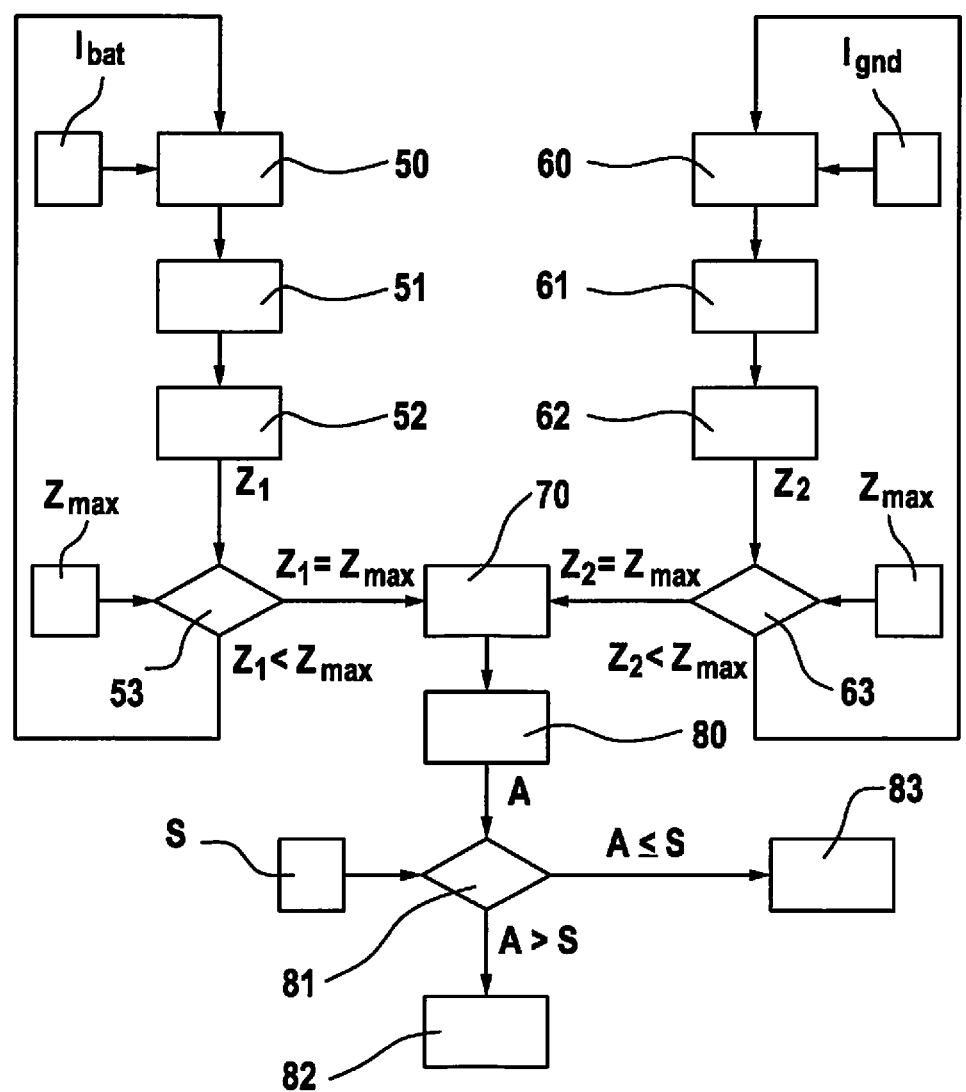
FIG. 3 shows a flowchart of another exemplary embodiment of the method according to the present invention.

FIGS. 2 and 3 each show a flowchart of two exemplary embodiments of the method according to the present invention. Identical reference numerals refer to identical functions or working steps and are therefore explained representing both figures. For both exemplary embodiments, a measurement 50 of current intensity $I_{bat}$ of the current through battery-side shunt 22 is carried out at the beginning with the aid of first detection device 30. Subsequently, a calculation 51 of the power loss at battery-side connection 21 is carried out with the aid of the $I^2t$ principle by squaring current intensity $I_{bat}$ of the current through battery-side shunt 22 and first count value $Z_1$ of first counting register 31 is increased 52 as a function of the power loss detected at battery-side connection 21.

Simultaneously, a measurement 60 of current intensity $I_{gnd}$ of the current through ground-side shunt 27 is carried out with the aid of second detection device 35. Analogously, a calculation 61 of the power loss at ground-side connection 26 is carried out with the aid of the $I^2t$ principle by squaring current intensity $I_{gnd}$ of the current through ground-side shunt 27 and second count value $Z_2$ of second counting register 36 is increased 62 as a function of the power loss detected at ground-side connection 26. First count value $Z_1$ and second count value $Z_2$ are compared 53, 63 independently from each other with a maximum count value $Z_{max}$. As this exemplary embodiment of the method according to the present invention runs through a circuit as shown in FIG. 1, in which the components correspond at battery-side connection 21 and at ground-side connection 26, a common maximum count value $Z_{max}$ is used for both counting registers 31 and 36.

In the exemplary embodiment shown in FIG. 2, bridge connection 10 is shut off 70 and the method ends 71 if one of the two count values $Z_1$ or $Z_2$ reaches maximum count value $Z_{max}$. If this is not the case, a comparison 80 between first count value $Z_1$ and second count value $Z_2$ takes place in a further step, over the course of which a deviation A is ascertained between the two count values $Z_1$ and $Z_2$. For this purpose, a difference is formed, for example, between the two count values $Z_1$ and $Z_2$ and subsequently the amount of the difference is computed.

In the exemplary embodiment shown in FIG. 3, bridge connection 10 is likewise shut off 70 if one of the two count values $Z_1$ or $Z_2$ reaches maximum count value $Z_{max}$. In this case, comparison 80 between first count value $Z_1$ and second count value $Z_2$ is subsequently carried out, it being established here whether the other count value $Z_1$ or $Z_2$ has likewise reached maximum count value $Z_{max}$. If the other count value $Z_1$ or $Z_2$ has not yet reached maximum count value $Z_{max}$, a deviation A between the two count values $Z_1$ and $Z_2$ is ascertained. This may be carried out as already explained in context with FIG. 2.

In both exemplary embodiments, deviation A is subsequently compared 81 to a threshold value S. Threshold value S is selected as a function of tolerances, including in the material. If deviation A between first count value $Z_1$ and second count value $Z_2$ lies above threshold value S, the creeping short circuit is detected 82. Otherwise, deviation A still lies in the tolerance range and no creeping short circuit is detected 83. With respect to the exemplary embodiment in FIG. 3, an increased load, for example on the basis of peak currents, may be additionally assumed in the latter case, as one of the two count values $Z_1$ or $Z_2$ has already reached maximum count value $Z_{max}$ and the other count value has likewise reached this or at least will shortly reach this.

What is claimed is:

1. A circuit for detecting a creeping short circuit in a bridge connection, comprising:
   a first detection device for a power loss at a battery-side connection of the bridge connection, the first detection device including a first counting register; and
   a second detection device for a power loss at a ground-side connection of the bridge connection, the second detection device including a second counting register,
   wherein the counting registers are configured to increase respective count values as a function of the detected power loss,
   wherein the respective count values are configured to be compared to each other,
   wherein the creeping short circuit is configured to be detected if a deviation between the respective count values lies above a threshold value.

2. The circuit of claim 1, wherein the detection devices for the power losses are configured to compute the power losses using the square of a measured current intensity.

3. The circuit of claim 2, wherein the detection devices for the power losses are configured to compute the power loss with the aid of the $I^2t$ principle using the square of the measured current intensity.

4. The circuit of claim 1, wherein the counting registers have a maximum count value.

5. A method for detecting a creeping short circuit in bridge connections with a circuit, the method comprising:
   detecting a power loss at a battery-side connection of a bridge connection by a first detection device, wherein the circuit for detecting includes the first detection device for the power loss at the battery-side connection of the bridge connection, the first detection device including a first counting register, and a second detection device for a power loss at a ground-side connection of the bridge connection, the second detection device including a second counting register;
   increasing a first count value of a first counting register of the first detection device as a function of the power loss detected at the battery-side connection;
   detecting a power loss at a ground-side connection of the bridge connection by a second detection device;
   increasing a second count value of a second counting register of the second detection device as a function of the power loss detected at the ground-side connection;
   comparing the first count value of the first counting register to the second count value of the second counting register;
   detecting the creeping short circuit if a deviation between the first count value and the second count value lies above a threshold value.

6. The method of claim 5, wherein the particular power loss is computed by squaring a measured current intensity.

7. The method of claim 6, wherein the squaring of the measured current intensity is carried out with the aid of an $I^2t$ principle.

8. The method of claim 5, wherein the comparing between the first count value of the first counting register and the second count value of the second counting register is only carried out if one of the count values has reached a maximum count value.

9. The method of claim 5, wherein the bridge connection is switched off if one of the count values reaches a maximum count value.

10. A non-transitory computer readable medium having a computer program, which is executable by a processor, comprising:
   a program code arrangement having program code for detecting a creeping short circuit in bridge connections with a circuit, by performing the following:

detecting a power loss at a battery-side connection of a bridge connection by a first detection device, wherein the circuit for detecting includes the first detection device for the power loss at the battery-side connection of the bridge connection, the first detection device including a first counting register, and a second detection device for a power loss at a ground-side connection of the bridge connection, the second detection device including a second counting register;

increasing a first count value of a first counting register of the first detection device as a function of the power loss detected at the battery-side connection;

detecting a power loss at a ground-side connection of the bridge connection by a second detection device;

increasing a second count value of a second counting register of the second detection device as a function of the power loss detected at the ground-side connection;

comparing the first count value of the first counting register to the second count value of the second counting register;

detecting the creeping short circuit if a deviation between the first count value and the second count value lies above a threshold value.

11. The computer readable medium of claim 10, wherein the detection devices for the power losses are configured to compute the power losses using the square of a measured current intensity.

12. An electronic arithmetic unit for detecting a creeping short circuit in bridge connections with a circuit, comprising:

a non-transitory computer readable medium having a computer program, which is executable by a processor, including a program code arrangement having program code for detecting the creeping short circuit in bridge connections with the circuit, by performing the following:

detecting a power loss at a battery-side connection of a bridge connection by a first detection device, wherein the circuit for detecting includes the first detection device for the power loss at the battery-side connection of the bridge connection, the first detection device including a first counting register, and a second detection device for a power loss at a ground-side connection of the bridge connection, the second detection device including a second counting register;

increasing a first count value of a first counting register of the first detection device as a function of the power loss detected at the battery-side connection;

detecting a power loss at a ground-side connection of the bridge connection by a second detection device;

increasing a second count value of a second counting register of the second detection device as a function of the power loss detected at the ground-side connection;

comparing the first count value of the first counting register to the second count value of the second counting register;

detecting the creeping short circuit if a deviation between the first count value and the second count value lies above a threshold value.

\* \* \* \* \*